United States Patent
Matsumoto (10) Patent No.: US 7,551,670 B2
(45) Date of Patent: Jun. 23, 2009

(54) UWB COMMUNICATION DEVICE AND UWB COMMUNICATION METHOD

(75) Inventor: Yasuhiro Matsumoto, Shiga (JP)

(73) Assignee: Git Japan, Inc., Shiga (JP)

( * ) Notice: Subject to any disclaimer, the term of this patent is extended or adjusted under 35 U.S.C. 154(b) by 731 days.

(21) Appl. No.: 11/182,673

(22) Filed: Jul. 15, 2005

(65) Prior Publication Data

US 2007/0014333 A1    Jan. 18, 2007

(51) Int. Cl.
*H04B 1/69* (2006.01)
*H03K 7/04* (2006.01)
*H04L 7/00* (2006.01)

(52) U.S. Cl. ..................................... 375/239

(58) Field of Classification Search ................. 375/239, 375/355; 327/10, 18; 329/313; 332/112
See application file for complete search history.

(56) References Cited

U.S. PATENT DOCUMENTS

| | | | | |
|---|---|---|---|---|
| 4,201,909 A | * | 5/1980 | Dogliotti et al. | ............ 398/189 |
| 5,640,160 A | * | 6/1997 | Miwa | ........................... 341/53 |
| 6,064,697 A | * | 5/2000 | Yoshikawa | .................. 375/242 |
| 6,304,600 B1 | * | 10/2001 | Chiba | ......................... 375/239 |
| 2001/0055353 A1 | * | 12/2001 | Rybicki et al. | .............. 375/353 |
| 2002/0130944 A1 | * | 9/2002 | Ema et al. | .................... 347/132 |

* cited by examiner

*Primary Examiner*—Chieh M Fan
*Assistant Examiner*—Aristocratis Fotakis
(74) *Attorney, Agent, or Firm*—Pillsbury Winthrop Shaw Pittman LLP (57) ABSTRACT

The present invention provides a UWB communication device and a UWB communication method with which the communication speed can be improved, and with which accurate sending and receiving of data and a lower power consumption can be achieved. A communication device in accordance with the present invention employs a sending/receiving method of sending four bits of data within four cycles of a system clock, sending the four bits of data by correlating them in a 1-to-1 relationship with seven types of pulse waveforms with only one pulse during the first seven half-cycles and nine different types of pulse waveforms with two pulses during the first seven half-cycles of four cycles of the system clock, and at the receiving side demodulating the modulated input data by correlating the sixteen types of pulse waveforms that have been sent back to the four bits of data. Furthermore, when receiving, the width of the received pulses is set to a length of 1.5 cycles of the quadruple system clock, and phase shifts are detected and adjusted by sampling the received pulses with the rising edges of the quadruple system clock.

15 Claims, 7 Drawing Sheets

UWB COMMUNICATION DEVICE AND UWB COMMUNICATION METHOD

BACKGROUND OF THE INVENTION

1. Field of the Invention

The present invention relates to communication devices and communication methods that exchange data with UWB (ultra wideband) technology.

2. Description of the Related Art

In recent years, UWB (ultra wideband) communication, which is a communication technology that uses an extremely wide frequency band, that can coexist with existing wireless technology and that allows high-speed broadband wireless communication, has garnered considerable attention. UWB communication enables high-speed communication by exclusively using an extremely wide frequency band of several GHz width in the frequency band of 3.1 Hz to 10.6 GHz for short pulses of only about 1 ns duration.

In UWB communication, PPM (pulse position modulation) in which the data is encoded based on the position of the pulse on the time axis is commonly used as the modulation method.

Figure 6:
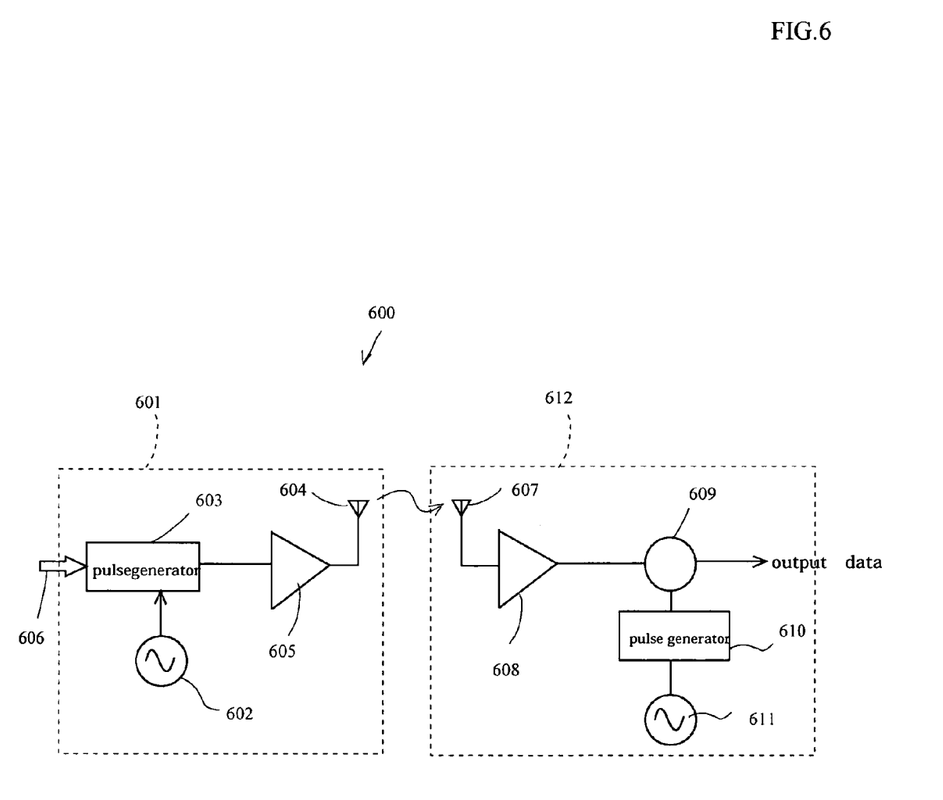
FIG. 6 shows an ordinary communication device for PPM modulation.
Figure 7:
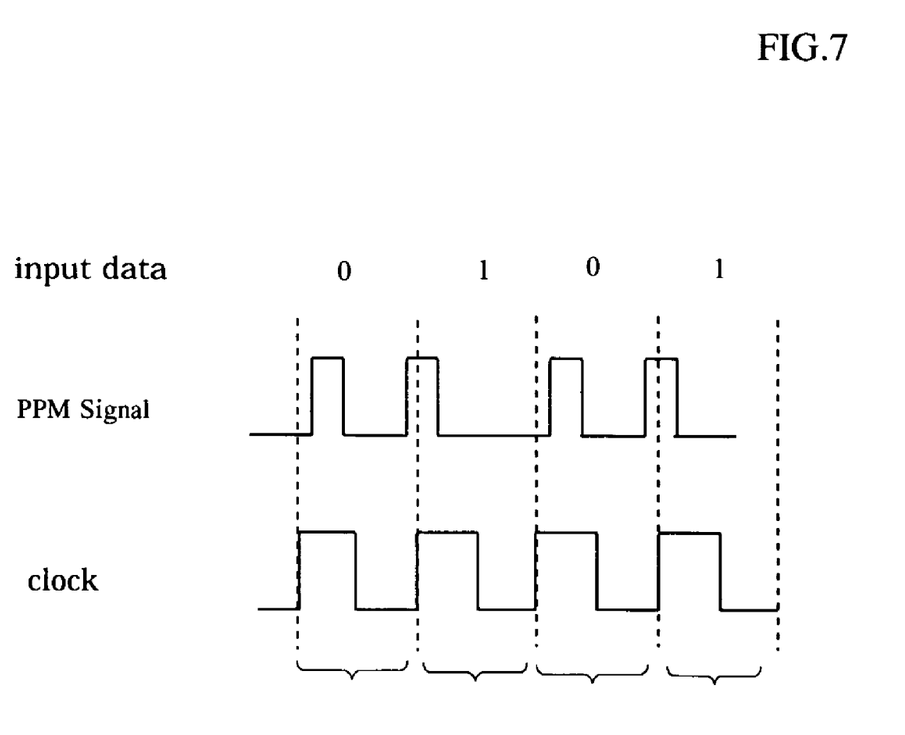
FIG. 7 is a waveform diagram of a PPM signal.

The following is a description of PPM modulation and the circuit configuration of a communication device that is commonly used for PPM modulation. FIG. 6 shows an ordinary communication device for PPM modulation. FIG. 7 is a waveform diagram of a PPM signal. "0101" is taken as an example of input data. In FIG. 6, numeral 600 denotes a communication device, numeral 601 denotes a sender, and numeral 612 denotes a receiver. The communication device 600 includes the sender 601 and the receiver 612. The sender 601 includes a pulse generator 603, an oscillator 602, an antenna 604, and an amplifier 605. The receiver 612 includes a LNA (low noise amplifier) 608, a pulse generator 610, an oscillator 611, and an antenna 607. The pulse generator 603 of the sender 601 generates PPM signals in synchronization with the clock of the oscillator 602. FIG. 7 is a waveform diagram showing the PPM signal generated by the pulse generator 603 of the sender 601. In this example, the pulse is located prior to the timing of the rising edge of the clock waveform when the data is "1", and the pulse is located after the timing of the rising edge of the clock waveform when the data is "0". Thus, with the PPM method, whether the data is "1" or "0" depends on the position of the pulses with respect to the clock.

The PPM signal is amplified by the amplifier 605 of the sender 601, and is radiated from the antenna 604. The radiated PPM signal is received by the antenna 607 of the receiver 612. The received PPM signal is passed through the low-noise amplifier 608, and then demodulated.

For the demodulation, the pulse generator 610 generates pulses in synchronization with the clock of the oscillator 611. In a mixer 609, the positions on the time axis of the pulses from the pulse generator 610 and of the pulses of the PPM signal are compared, and a decision whether the data is "0" or "1" is made, thus demodulating the PPM signal and obtaining the output data. The following is a discussion of the pulses serving as the PPM signal. With PPM modulation, a pulse serving as a PPM signal is sent out at every clock signal, and when a "0" follows a "1" or when a "1" follows a "0", the interval between pulses is narrower than when a "1" follows a "1" or when a "0" follows a "0". This puts a limitation on the transfer rate. Furthermore, since pulses are generated for each and every data item, there are also problems with regard to energy consumption. Moreover, when the pulse positions in the PPM output change due to problems with regard to jitter and the like, the data cannot be properly received. It should be noted that "jitter" refers to irregularities in pulse amplitude, width, position or the like.

SUMMARY OF THE INVENTION

Accordingly, the present invention provides a UWB communication device and a UWB communication method with which the communication speed can be improved, and with which accurate sending and receiving of data and a lower power consumption can be achieved.

In contrast to PPM modulation, which is the ordinary modulation method for UWB communication, a communication device in accordance with the present invention is characterized in that it sends or receives four bits of data within four cycles of a system clock, sends the four bits of data by correlating them in a 1-to-1 relationship with seven types of pulse waveforms with only one pulse during the first seven half-cycles and nine different types of pulse waveforms with two pulses during the first seven half-cycles of four cycles of the system clock, and at the receiving side demodulates the modulated input data by correlating the sixteen types of pulse waveforms that have been sent back to the four bits of data. It should be noted that when two pulses are generated, the interval between neighboring pulses is set to at least one half-cycle.

Comparing this modulation method with the PPM modulation method, it can be seen that in PPM modulation, one pulse is always generated in each cycle. Therefore, the interval between neighboring pulses is short, and when the baud rate is increased, errors occur during the demodulation step due to jitter or the like, so that there is a limitation on the sending speed. Also, the fact that a pulse is always generated in each cycle acts as an impediment to reducing power consumption. By comparison, sending and receiving in accordance with the present invention is performed with a lower number of pulses and the interval of neighboring pulses is wider, so that the system becomes more robust against jitter, and it becomes possible to increase the sending speed. Furthermore, the power consumption can be further reduced.

As far as the sending speed is concerned, by making the interval between neighboring pulses at least one half-cycle in the nine different types of waveforms with two pulses in the first seven half-cycles, the system becomes more robust against jitter and the like, and it becomes possible to realize a higher sending speed.

Moreover, a modulation circuit modulating four bits of data into sixteen types of pulse waveforms includes:

a 4-in-7-out transformation circuit having four input terminals and seven output terminals, which transforms sixteen types of 4-bit data into seven states in which respectively one of the seven output terminals is "1", and nine states in which respectively two different non-adjacent output terminals of the seven output terminals are "1"; a timing generator having seven output terminals, the timing generation circuit generating a pulse at the first output terminal only during the first half-cycle of four cycles of the system clock, generating a pulse at the second output terminal only during the second half-cycle of four cycles of the system clock, generating a pulse at the third output terminal only during the third half-cycle of four cycles of the system clock, generating a pulse at the fourth output terminal only during the fourth half-cycle of four cycles of the system clock, generating a pulse at the fifth output terminal only during the fifth half-cycle of four cycles of the system clock, generating a pulse at the sixth output terminal only during the sixth half-cycle of four cycles of the system clock, and generating a pulse at the seventh output terminal only during the seventh half-cycle of four cycles of the system clock; seven 2-in-1-out logical AND circuits and one 7-in-1-out logical OR circuit, the input terminals of the first logical AND circuit are respectively connected to the first output terminal of the 4-in-7-out transformation circuit and to the first output terminal of the timing generator, the input terminals of the second logical AND circuit are respectively connected to the second output terminal of the 4-in-7-out transformation circuit and to the second output terminal of the timing generator, the input terminals of the third logical AND circuit are respectively connected to the third output terminal of the 4-in-7-out transformation circuit and to the third output terminal of the timing generator, the input terminals of the fourth logical AND circuit are respectively connected to the fourth output terminal of the 4-in-7-out transformation circuit and to the fourth output terminal of the timing generator, the input terminals of the fifth logical AND circuit are respectively connected to the fifth output terminal of the 4-in-7-out transformation circuit and to the fifth output terminal of the timing generator, the input terminals of the sixth logical AND circuit are respectively connected to the sixth output terminal of the 4-in-7-out transformation circuit and to the sixth output terminal of the timing generator, and the input terminals of the seventh logical AND circuit are respectively connected to the seventh output terminal of the 4-in-7-out transformation circuit and to the seventh output terminal of the timing generator; and the seven input terminals of the 7-in-1-out logical OR circuit are respectively connected to the output terminals of the seven logical AND circuits, and the one output terminal of the 7-in-1-out logical OR circuit is taken as the output terminal of the circuit modulating the 4-bit data into the sixteen types of pulse waveforms.

Moreover, a method for receiving data that has been sent by a sending method in which send pulses are sent as 4-bit data over a communication path, the sending method:

modulating sixteen types of data arising from four bits of data into a total of sixteen different types of pulse waveforms, namely:

seven types of pulse waveforms, each having one pulse at a different half-cycle over a period of the first to seventh half-cycle out of four cycles of a system clock, and nine types of pulse waveforms having two pulses at different non-adjacent half-cycles over a period of the first to seventh half-cycle out of four cycles of the system clock, and sending four bits of data within four cycles of the system clock by sending the sixteen types of pulse waveforms, comprises:

sampling the received data at the rising edges of the quadruple system clock and setting the pulse width of the received input pulses to 1.5 cycles of the quadruple system clock;

detecting a variation in the phase of the received input pulses from the pulse width of the result of sampling the received data with the rising edges of the quadruple system clock; and tracking variations by changing a subsequent detection phase based on variations in the detected pulse positions. By setting the received input pulse width to 1.5 cycles of the quadruple system clock, each single received input pulse is detected always once or always twice with the quadruple system clock, as long as there is no change in the phase of the pulses. The quadruple system clock is a clock that operates at four times the rate of the system clock. If there are shifts in the pulse position due to jitter or variations in the sending/receiving frequency, then the sampled pulse width varies. With the present invention, these variations are detected, and are tracked by changing a subsequent detection phase.

These and other advantages of the present invention will become more apparent from the following detailed description of the present invention when taken in conjunction with the accompanying drawings.

DESCRIPTION OF THE PREFERRED EMBODIMENTS

The following is a description of preferred embodiments of the present invention, with reference to the accompanying drawings.

Figure 1:
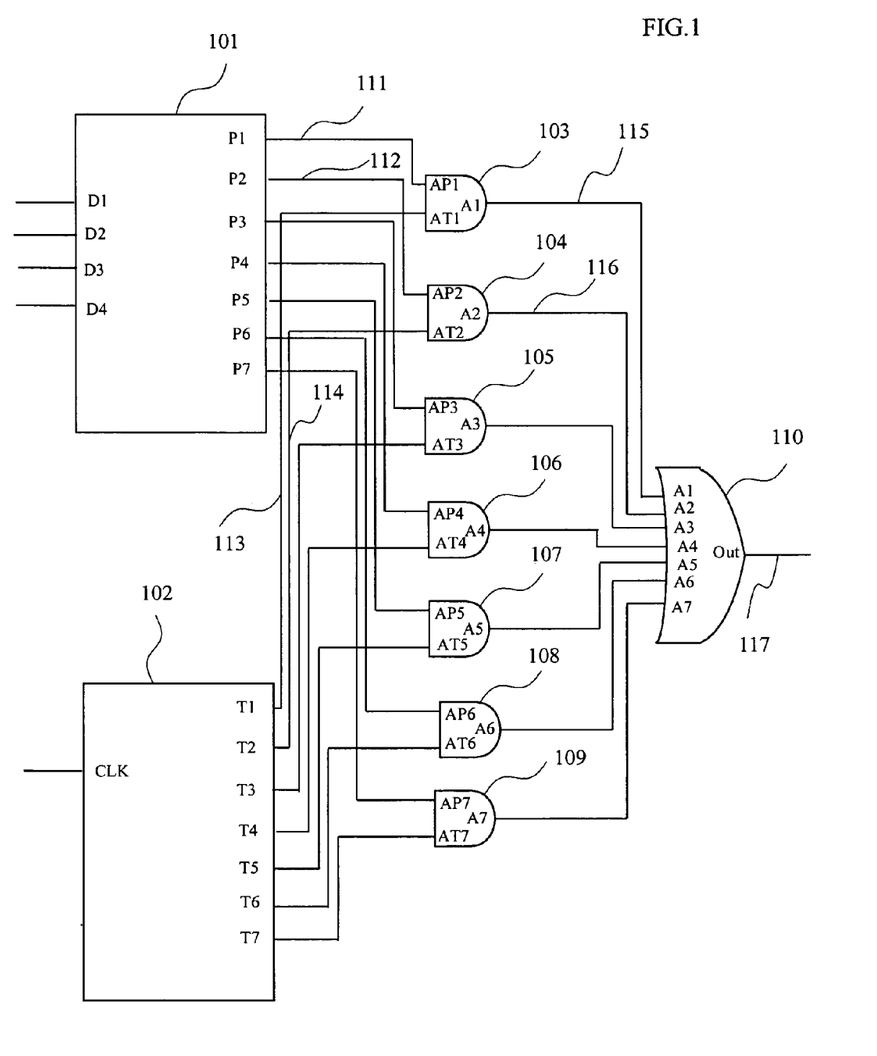
FIG. 1 is a block diagram showing an outline of a modulation circuit of a sender in accordance with the present invention.

FIG. 1 is a block diagram showing an outline of a modulation circuit in a sender according to the present invention.

This sender sends sixteen types of data, represented by 4 bits, in correspondence with sixteen types of pulse waveforms extending over four cycles of a system clock. In FIG. 1, numeral 101 denotes a 4-in-7-out transformer, which produces, with regard to sixteen types of data represented by four bits, a total of sixteen types of outputs, namely seven types of outputs in which only one of the seven output pins P1 to P7 is "1" and the other output pins are "0", and 9 types of output in which two non-neighboring output pins are "1" and the other output pins are "0". Numeral 102 is a timing generation circuit, which, based on the system clock, generates successive pulses during the first seven half-cycles of four cycles of the system clock. Numerals 103 to 109 denote 2-in-1-out logical AND circuits. Numeral 110 denotes a 7-in-1-out logical OR circuit. Numeral 111 denotes a line connecting the first output of the transformer 101 with the input of the first 2-in-1-out logical AND circuit. Numeral 112 denotes a line connecting the second output of the transformer 101 with the input of the second 2-in-1-out logical AND circuit 104. Numeral 113 denotes a line connecting the first output of the timing generator 102 with the input of the first 2-in-1-out logical AND circuit 103. Numeral 114 denotes a line connecting the second output of the timing generator 102 with the input of the second 2-in-1-out logical AND circuit 104. Numeral 115 denotes a line connecting the output of the first 2-in-1-out logical AND circuit 103 with the first input of the 7-in-1-out logical OR circuit 110. Numeral 116 denotes a line connecting the output of the second 2-in-1-out logical AND circuit 104 with the second input of the 7-in-1-out logical OR circuit 110. Numeral 117 denotes the output from the 7-in-1-out logical OR circuit 110.

Figure 2:
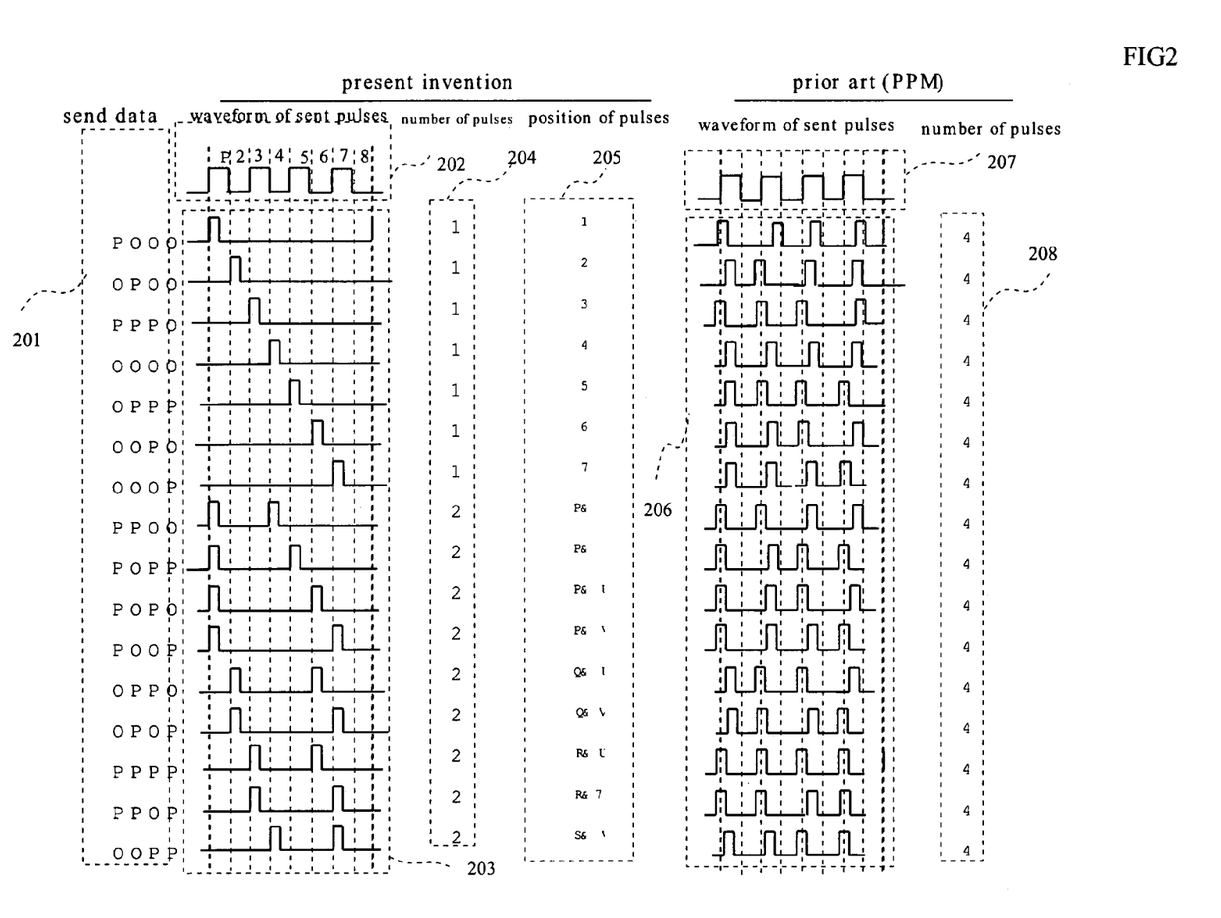
FIG. 2 is a diagram showing how four-bit input data is turned into sixteen types of pulse waveforms by the transformer 101, the timing generator 102, the 2-in-1-out logical AND circuits 103 to 109, and the 7-in-1-out logical OR circuit 110 in FIG. 1.

FIG. 2 is a diagram showing how four-bit input data is turned into sixteen types of pulse waveforms by the transformer 101, the timing generator 102, the 2-in-1-out logical AND circuits 103 to 109, and the 7-in-1-out logical OR circuit 110 in FIG. 1. In FIG. 2, numeral 201 denotes 4-bit send data, of which there are sixteen types. Numeral 202 denotes four cycles of the system clock. Numeral 203 denotes the sixteen types of pulse waveforms, transformed by the modulation circuit according to the present invention. The pulses are present only for the first seven half-cycles of four cycles, and there is no pulse in the last, eighth half-cycle. At least one half-cycle is ensured as the interval between neighboring pulses, so that there are no false recognitions even when there are irregularities in the timing due to jitter or the like. Numeral 204 denotes the number of pulses during the seven half-cycles. Numeral 205 indicates the numbers of the half-cycles during which a pulse is generated. There are only the seven waveforms shown in FIG. 2 as the pulse waveforms in which a pulse is generated only once during the seven half-cycles, whereas the pulse waveforms in which two pulses are generated may also be different from the nine types shown in FIG. 2. However, it is required that an interval of at least one half-cycle between neighboring pulses is ensured. Numeral 206 denotes the pulse waveforms for the case that the 4-bit send data 201 is sent with the conventional PPM method. Whether the send data is "0" or "1" is determined in accordance with the position of the pulse. In the present example, the send data is "1" if the pulse is prior, and "0" if the pulse comes after the rising edge of the system clock. Numeral 208 denotes the number of pulses that are present during four cycles of the system clock with the PPM method. Due to the fact that the PPM method is used, this number is always four. Thus, the number of pulses 204 generated during four cycles of the system clock in the communication method according to the present invention is lower than the number of pulses generated with the PPM method. Therefore, it is possible to reduce the energy consumption. Moreover, with the PPM method, there is always a pulse in each cycle, so that the interval between adjacent pulses becomes short, and the system is susceptible to jitter, making it difficult to increase the transmission speed. In the case of the communication method according to the present invention, the number of pulses 204 that are present during four cycles of the system clock is lower than the number of pulses in the case of the PPM method, so that the interval between neighboring pulses is wider, and an interval of at least one half-cycle can be ensured, making it possible to increase the transmission speed beyond that of the PPM method.

Figure 3:
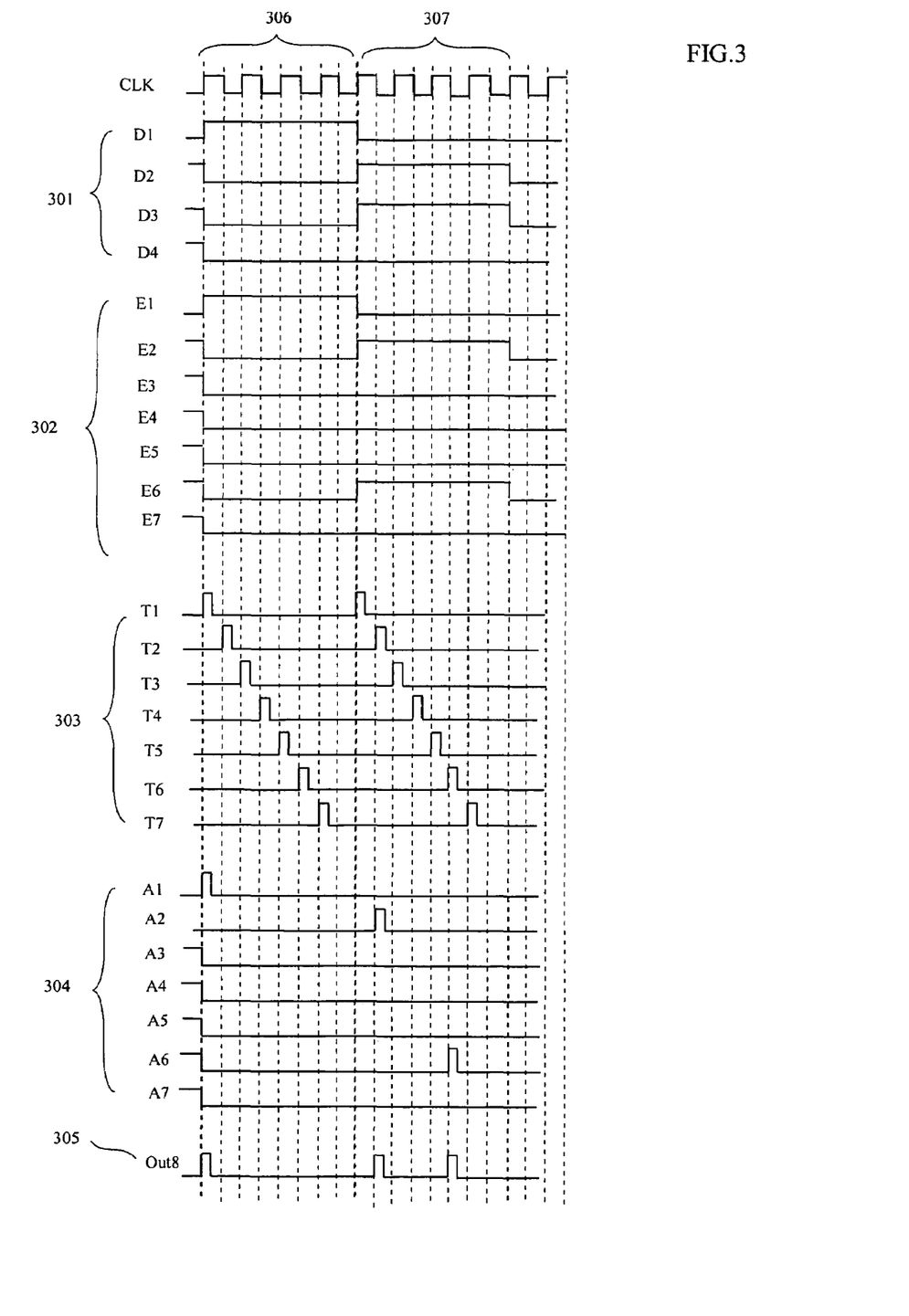
FIG. 3 is a graph showing the input and output states of the transformer 101, the timing generator 102, the 2-in-1-out logical AND circuits 103 to 109, and the 7-in-1-out logical OR circuit 110, for the case that the 4-bit input data is 1000 and the case that the 4-bit input data is 0110.

FIG. 3 is a graph showing the input and output states of the transformer 101, the timing generator 102, the 2-in-1-out logical AND circuits 103 to 109, and the 7-in-1-out logical OR circuit 110, for the case that the 4-bit input data is 1000 and the case that the 4-bit input data is 0110. In FIG. 3, numeral 306 denotes the first four cycles, and numeral 307 denotes the next four cycles. D1 to D4 of 301 represent the corresponding input pins of the transformer 101, and indicate whether the four bits of the applied input data are "1" or "0". The 4-bit data of the first four cycles 306 is "1000". Numeral 302 represents the output pins of the transformer 101. During the first four cycles 306, only the output pin E1 is "1", whereas the other output pins E2 to E7 are all "0". Numeral 303 represents the output pins of the timing generator 102. T1 generates a pulse during the first half-cycle of the first four cycles 306, T2 generates a pulse during the second half-cycle of the first four cycles 306, and also the following output pins successively generate pulses in each half-cycle. Numeral 304 represents the output pins A1 to A7 of the seven 2-in-1-out logical AND circuits 103 to 109. A1 generates a pulse in the first half-cycle of the first four cycles 306. The reason for this is that during the first half-cycle of the firs four cycles 306, E1, which is the input into the first 2-in-1-out logical AND circuit 103, is "1", and a pulse is input into T1, which is the other input into the AND circuit 103, so that the logical AND is true during precisely the period in which the pulse is generated. The other output pins A2 to A7 are all "0". Numeral 305 represents the output of the 7-in-1-out logical OR circuit. 305 generates a pulse during the first half-cycle of the first four cycles 306. This is because a pulse is input by A1, whereas the other output pins A2 to A7 are all "0", because E2 to E7 are "0". Following the same logic, the input data is "0110" during the next four cycles 307, so that D2 and D3 are "1", and E2 and E6 are "1". As a result, pulses are generated at A2 and A6, and 305 generates pulses at the second and at the sixth half-cycle of the second four cycles 307. The pulse waveform of 305 during the first four cycles 306 corresponds to the pulse waveform for the send data "1000" of the pulse waveform 203 in FIG. 2, whereas the pulse waveform during the next four cycles 307 corresponds to the pulse waveform for the send data "0110" of the pulse waveform 203 in FIG. 2. Following the same logic, the modulation circuit in FIG. 1 modulates the send data 201 shown in FIG. 2 to the pulse waveforms 203. It should be noted, however, that the circuit in FIG. 1 is merely an example of a modulation circuit that can realize a sending method in accordance with the present invention. The following is a description of a receiving method.

Figure 4:
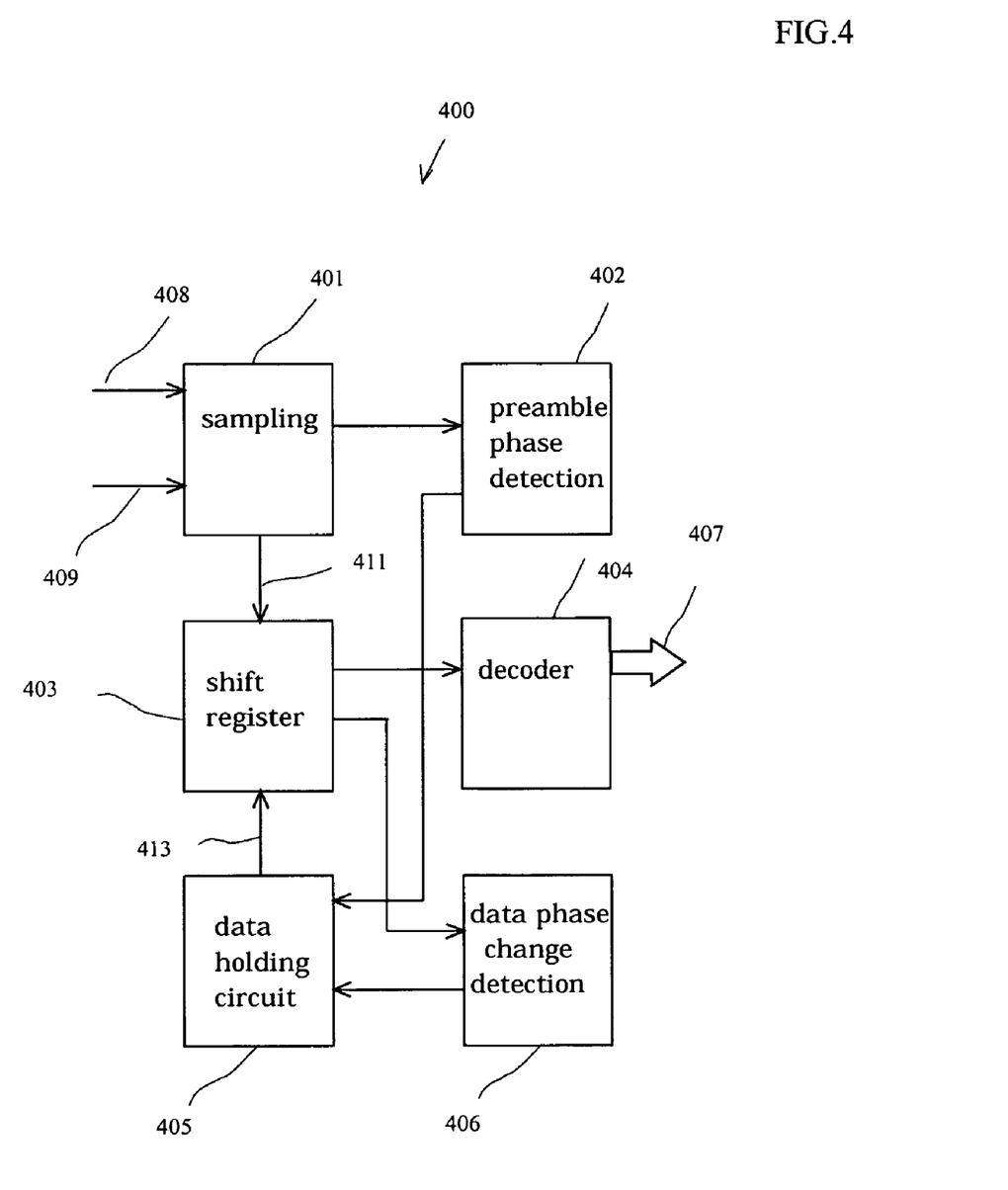
FIG. 4 is a block diagram showing an outline of a receiver.

FIG. 4 is a block diagram showing an outline of a receiver. In FIG. 4, numeral 401 denotes a sampling circuit, which samples received pulses. Numeral 402 denotes a preamble phase detection circuit. Numeral 403 denotes a shift register. Numeral 404 denotes a decoder. Numeral 405 denotes a data holding circuit. Numeral 406 denotes a data phase change detection circuit. Numeral 408 denotes a received pulse. Numeral 409 denotes a sampling clock. Numeral 411 denotes a sampling result. Numeral 413 denotes phase information from the data holding circuit 405.

Figure 5:
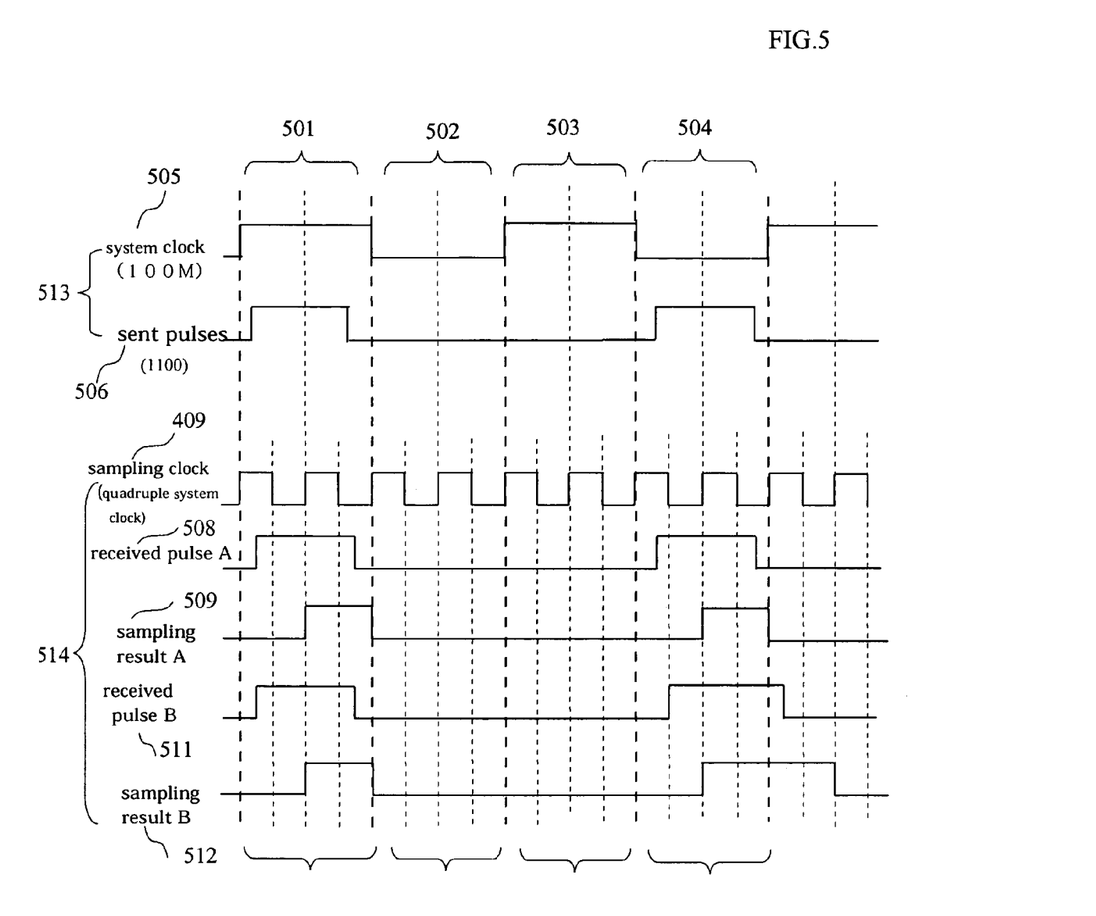
FIG. 5 is a waveform diagram of sent pulses, received pulses and sampling results.

FIG. 5 is a waveform diagram of sent pulses, received pulses and sampling results. In FIG. 5, numeral 501 denotes the first cycle of the send clock, numeral 502 denotes the second cycle of the send clock, numeral 503 denotes the third cycle of the send clock, and numeral 504 denotes the fourth cycle of the send clock. Numeral 513 marks the waveforms during sending. Numeral 505 denotes the system clock during sending. The following description refers to FIG. 4 and FIG. 5. The sampling circuit 401 samples the received pulses 408 at the rising edge of the sampling clock 409. The preamble phase detection circuit 402 detects the preamble pattern included in the first portion of the input pulses, and sends this information to the data hold circuit. The shift register 403 shifts the sampling result 411 from the sampling circuit 401 in accordance with the phase information 413 from the data hold circuit 405, and sends the result to the decoder 404. The decoder 404 demodulates the data from the shift register 403 into 4-bit data. The sampling clock 409 in FIG. 5 is four times as fast as the system clock for sending in FIG. 5. The received pulse A508 is sampled at the rising edge of the sampling clock 409. Numeral 509 denotes the sampling result A. Here, the width of the received pulse A508 is set to 1.5 cycles of the quadruple system clock 409. Quadruple system clock 409 is a clock that operates at four times the rate of the system clock. Thus, since the interval between neighboring rising edges of the sampling clock 409 is one cycle, when the phase of the received pulses shifts, it may occur that one of the received pulses is sampled consecutively twice by the sampling clock 409. This is shown in FIG. 5. The received pulses B 511 are a received pulse train, whose phase is slightly shifted with respect to that of the received pulses A 508. The result of sampling the received pulses B 511 with the sampling clock 409 is the sampling result B 512. The pulse width of the second pulse of the received pulses B511 is slightly wider than the pulse width of the second pulse of the received pulses A, and due to this slight difference, the received pulses B 511 are sampled as two consecutive "1" s by the sampling clock 409. The data phase detection circuit detects a phase shift due to the fact that a "1" has been sampled consecutively twice, and sends information regarding this phase shift to the data holding circuit 405. If this phase shift continues in the same direction, then a "1" is detected once at first, then a "1" is detected twice, and if there is a further shift, then the system will return to detecting a "1" only once. By monitoring this situation, the direction of the phase shift is detected. The data holding circuit 405 sends information regarding this phase shift to the shift register 403. In consideration of the information regarding the phase shift, the shift register 403 corrects the phase shift with regard to the data sent from the sampling circuit 401. With the above-described method, a receiver according to the present invention can adapt itself to phase changes and can correctly receive send pulses without using a PLL (phase-locked loop), by adapting itself to phase changes of the receiver clock. Here, the width of the received pulses should be broader than one cycle and narrower than two cycles of the sampling clock, and a width of 1.5 cycles of the sampling clock is appropriate.

The preamble phase detection circuit 402 detects the preamble pattern. It should be noted that elements of the sender other than the above-described modulation circuit, the demodulation circuit, and the method for correcting phase shifts of the received pulses may be similar as in the related art.

While the invention has been described in detail, the foregoing description is in all aspects illustrative and not restrictive. It is understood that numerous other modifications and variations can be devised without departing from the scope of the invention.

What is claimed is:

1. A method for sending 4-bit data over a communication path, the method comprising:
   modulating sixteen types of data arising from four bits of data into a total of sixteen different types of pulse waveforms, wherein:
      seven types of pulse waveforms, each having one pulse at a different half-cycle over a period of the first to seventh half-cycle out of four cycles of a system clock, and
      nine types of pulse waveforms having two pulses at different nonadjacent half-cycles over a period of the first to seventh half-cycle out of four cycles of the system clock; and
   sending four bits of data within four cycles of the system clock by sending the sixteen types of pulse waveforms.

2. A method for receiving data that has been sent by:
   modulating sixteen types of data arising from four bits of data into a total of sixteen different types of pulse waveforms, wherein:
      seven types of pulse waveforms, each having one pulse at a different half-cycle over a period of the first to seventh half-cycle out of four cycles of a system clock, and
      nine types of pulse waveforms having two pulses at different non-adjacent half-cycles over a period of the first to seventh half-cycle out of four cycles of the system clock; and
   sending four bits of data within four cycles of the system clock by sending the sixteen types of pulse waveforms,
   the method comprising, in order to receive four bits of data sent through sixteen types of pulse waveforms, demodulating and receiving the four bits of data from the sixteen types of pulse waveforms through a correspondence relation that is inverse to a correspondence relation used when sending.

3. A method for receiving data that has been sent by:
   modulating sixteen types of data arising from four bits of data into a total of sixteen different types of pulse waveforms, wherein:
      seven types of pulse waveforms, each having one pulse at a different half-cycle over a period of the first to seventh half-cycle out of four cycles of a system clock, and
      nine types of pulse waveforms having two pulses at different non-adjacent half-cycles over a period of the first to seventh half-cycle out of four cycles of the system clock, and
   sending four bits of data within, four cycles of the system clock by sending the sixteen types of pulse waveforms,
   the method comprising:
   setting the pulse width of the received pulses to 1.5 cycles of the quadruple system clock;
   sampling the received data at the rising edges of the quadruple system clock;
   detecting a variation in the position of the received data pulses from the width of the sampled pulses;
   tracking variations by changing a subsequent detection phase based on variations in the detected pulse positions; and
   demodulating and receiving four bits of data in accordance with a correspondence relation between the four bits of data when sending and said total of 16 different pulse waveforms that is inverse to a correspondence relation used when sending, to demodulate the sampled result.

4. A communication method for sending and receiving 4-bit data over a communication path, the method comprising:
   when sending:
      modulating sixteen types of data arising from four bits of data into a total of sixteen different types of pulse waveforms, wherein:
         seven types of pulse waveforms, each having one pulse at a different half-cycle over a period of the first to seventh half-cycle out of four cycles of a system clock, and
         nine types of pulse waveforms having two pulses at different non-adjacent half-cycles over a period of the first to seventh half-cycle out of four cycles of the system clock; and
      sending four bits of data within four cycles of the system clock by sending the sixteen types of pulse waveforms; and
   when receiving:
      setting the pulse width of the received pulses to 1.5 cycles of the quadruple system clock;
      sampling the received data at the rising edges of the quadruple system clock;
      detecting a variation in the position of the received data pulses from the width of the sampled pulses;

tracking variations by changing a subsequent detection phase based on variations in the detected pulse positions; and demodulating and receiving four bits of data in accordance with a correspondence relation between the four bits of data when sending and said total of 16 different pulse waveforms that is inverse to a correspondence relation used when sending, to demodulate the sampled result.

5. A communication device for sending 4-bit data over a communication path, comprising of:

a modulation circuit for modulating sixteen types of data arising from four bits of data into a total of sixteen different types of pulse waveforms, wherein:

seven types of pulse waveforms, each having one pulse at a different half-cycle over a period of the first to seventh half-cycle out of four cycles of a system clock, and nine types of pulse waveforms having two pulses at different non-adjacent half-cycles over a period of the first to seventh half-cycle out of four cycles of the system clock; and a transmitting circuit for sending four bits of data within four cycles of the system clock by sending the sixteen types of pulse waveforms.

6. A receiver receiving data that has been sent by:

modulating sixteen types of data arising from four bits of data into a total of sixteen different types of pulse waveforms, wherein:

seven types of pulse waveforms, each having one pulse at a different half-cycle over a period of the first to seventh half-cycle out of four cycles of a system clock, and nine types of pulse waveforms having two pulses at different non-adjacent half-cycles over a period of the first to seventh half-cycle out of four cycles of the system clock; and four bits of data are sent within four cycles of the system clock by sending the sixteen types of pulse waveforms, wherein the receiver takes the pulse width of the received pulses as 1.5 cycles of the quadruple system clock and comprises;

a sampler for sampling the received data at the rising edges of the quadruple system clock;

a detector that detects a variation in the position of the received data pulses from the width of the sampled pulses;

a phase change detector that tracks variation by changing a subsequent detection phase based on variations in the detected pulse positions;

and a demodulator that demodulates and receives four bits of data in accordance with a correspondence relation between the four bits of data when sending and said total of 16 different pulse waveforms that is inverse to a correspondence relation used when sending, to demodulate the sampled result.

7. A communication device comprises a transmitter for sending and a receiver for receiving 4-bit data over a communication path, which:

wherein the transmitter comprises of:

a modulation circuit that modulates sixteen types of data arising from four bits of data into a total of sixteen different types of pulse waveforms, wherein:

seven types of pulse waveforms, each having one pulse at a different half-cycle over a period of the first to seventh half-cycle out of four cycles of a system clock, and nine types of pulse waveforms having two pulses at different non-adjacent half-cycles over a period of the first to seventh half-cycle out of four cycles of the system clock;

and a transmitting circuit that sends four bits of data within four cycles of the system clock by sending the sixteen types of pulse waveforms; and wherein the receiver comprises of:

a sampler that takes the pulse width of the received pulses as 1.5 cycles of the quadruple system clock;

and samples the received pulses at the rising edges of the quadruple system clock;

a detector that detects a variation in the position of the received data pulses from the width of the sampled pulses;

and a phase change detector that tracks variations by changing a subsequent detection phase based on variations in the detected pulse positions;

and a demodulator that demodulates and receives four bits of data in accordance with a correspondence relation between the four bits of data when sending and said total of 16 different pulse waveforms that is inverse to a correspondence relation used when sending, to demodulate the sampled result.

8. A modulation circuit for modulating 4-bit data into sixteen types of pulse waveforms, the modulation circuit comprising:

a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1", a timing generation circuit having seven output terminals, the timing generation circuit:

generating a pulse at the first output terminal only during the first half-cycle of four cycles;

generating a pulse at the second output terminal only during the second half-cycle of four cycles;

generating a pulse at the third output terminal only during the third half-cycle of four cycles;

generating a pulse at the fourth output terminal only during the fourth half-cycle of four cycles;

generating a pulse at the fifth output terminal only during the fifth half-cycle of four cycles;

generating a pulse at the sixth output terminal only during the sixth half-cycle of four cycles;

generating a pulse at the seventh output terminal only during the seventh half-cycle of four cycles;

a first logical AND circuit with two input terminals and one output terminal, one of the two input terminals being connected to the first of the seven output terminals of the transformation circuit and the other of the two input terminals being connected to the first of the seven output terminals of the timing generator;

a second logical AND circuit with two input terminals and one output terminal, one of the two input terminals being connected to the second of the seven output terminals of the transformation circuit and the other of the two input terminals being connected to the second of the seven output terminals of the timing generator;

a third logical AND circuit with two input terminals and one output terminal, one of the two input terminals being connected to the third of the seven output terminals of the transformation circuit and the other of the two input terminals being connected to the third of the seven output terminals of the timing generator;
a fourth logical AND circuit with two input terminals and one output terminal, one of the two input terminals being connected to the fourth of the seven output terminals of the transformation circuit and the other of the two input terminals being connected to the fourth of the seven output terminals of the timing generator;
a fifth logical AND circuit with two input terminals and one output terminal, one of the two input terminals being connected to the fifth of the seven output terminals of the transformation circuit and the other of the two input terminals being connected to the fifth of the seven output terminals of the timing generator;
a sixth logical AND circuit with two input terminals and one output terminal, one of the two input terminals being connected to the sixth of the seven output terminals of the transformation circuit and the other of the two input terminals being connected to the sixth of the seven output terminals of the timing generator;
a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and
a logical OR circuit with seven input terminals and one output terminal, whose input terminals are connected to the seven output terminals of the first to seventh logical AND circuits.

9. The sending method according to claim 1, wherein the modulation is carried out by a modulation circuit comprising:
a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1",
a timing generation circuit having seven output terminals, the timing generation circuit:
generating a pulse at the first output terminal only during the first half-cycle of four cycles;
generating a pulse at the second output terminal only during the second half-cycle of four cycles;
generating a pulse at the third output terminal only during the third half-cycle of four cycles;
generating a pulse at the fourth output terminal only during the fourth half-cycle of four cycles;
generating a pulse at the fifth output terminal only during the fifth half-cycle of four cycles;
generating a pulse at the sixth output terminal only during the sixth half-cycle of four cycles;
generating a pulse at the seventh output terminal only during the seventh half-cycle of four cycles;
a first logical AND circuit with two input terminals and one output terminal, one of the two input terminals being connected to the first of the seven output terminals of the transformation circuit and the other of the two input terminals being connected to the first of the seven output terminals of the timing generator;
a second logical AND circuit with two input terminals and one output terminal, one of the two input terminals being connected to the second of the seven output terminals of the transformation circuit and the other of the two input terminals being connected to the second of the seven output terminals of the timing generator;
a third logical AND circuit with two input terminals and one output terminal, one of the two input terminals being connected to the third of the seven output terminals of the transformation circuit and the other of the two input terminals being connected to the third of the seven output terminals of the timing generator;
a fourth logical AND circuit with two input terminals and one output terminal, one of the two input terminals being connected to the fourth of the seven output terminals of the transformation circuit and the other of the two input terminals being connected to the fourth of the seven output terminals of the timing generator;
a fifth logical AND circuit with two input terminals and one output terminal, one of the two input terminals being connected to the fifth of the seven output terminals of the transformation circuit and the other of the two input terminals being connected to the fifth of the seven output terminals of the timing generator;
a sixth logical AND circuit with two input terminals and one output terminal, one of the two input terminals being connected to the sixth of the seven output terminals of the transformation circuit and the other of the two input terminals being connected to the sixth of the seven output terminals of the timing generator;
a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and
a logical OR circuit with seven input terminals and one output terminal, whose input terminals are connected to the seven output terminals of the first to seventh logical AND circuits.

10. The receiving method according to claim 2, wherein the modulation is carried out by a modulation circuit comprising:
a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1",
a timing generation circuit having seven output terminals, the timing generation circuit:
generating a pulse at the first output terminal only during the first half-cycle of four cycles;
generating a pulse at the second output terminal only during the second half-cycle of four cycles;
generating a pulse at the third output terminal only during the third half-cycle of four cycles;
generating a pulse at the fourth output terminal only during the fourth half-cycle of four cycles;
generating a pulse at the fifth output terminal only during the fifth half-cycle of four cycles;
generating a pulse at the sixth output terminal only during the sixth half-cycle of four cycles;
generating a pulse at the seventh output terminal only during the seventh half-cycle of four cycles;
a first logical AND circuit with two input terminals and one output terminal, one of the two input terminals being connected to the first of the seven output terminals of the transformation circuit and the other of the two input terminals being connected to the first of the seven output terminals of the timing generator;

a second logical AND circuit with two input terminals and one output terminal, one of the two input terminals being connected to the second of the seven output terminals of the transformation circuit and the other of the two input terminals being connected to the second of the seven output terminals of the timing generator;

a third logical AND circuit with two input terminals and one output terminal, one of the two input terminals being connected to the third of the seven output terminals of the transformation circuit and the other of the two input terminals being connected to the third of the seven output terminals of the timing generator;

a fourth logical AND circuit with two input terminals and one output terminal, one of the two input terminals being connected to the fourth of the seven output terminals of the transformation circuit and the other of the two input terminals being connected to the fourth of the seven output terminals of the timing generator;

a fifth logical AND circuit with two input terminals and one output terminal, one of the two input terminals being connected to the fifth of the seven output terminals of the transformation circuit and the other of the two input terminals being connected to the fifth of the seven output terminals of the timing generator;

a sixth logical AND circuit with two input terminals and one output terminal, one of the two input terminals being connected to the sixth of the seven output terminals of the transformation circuit and the other of the two input terminals being connected to the sixth of the seven output terminals of the timing generator;

a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and a logical OR circuit with seven input terminals and one output terminal, whose input terminals are connected to the seven output terminals of the first to seventh logical AND circuits.

11. The receiving method according to claim 3, wherein the modulation is carried out by a modulation circuit comprising:

a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1", a timing generation circuit having seven output terminals, the timing generation circuit:

generating a pulse at the first output terminal only during the first half-cycle of four cycles;

generating a pulse at the second output terminal only during the second half-cycle of four cycles;

generating a pulse at the third output terminal only during the third half-cycle of four cycles;

generating a pulse at the fourth output terminal only during the fourth half-cycle of four cycles;

generating a pulse at the fifth output terminal only during the fifth half-cycle of four cycles;

generating a pulse at the sixth output terminal only during the sixth half-cycle of four cycles;

generating a pulse at the seventh output terminal only during the seventh half-cycle of four cycles;

a first logical AND circuit with two input terminals and one output terminal, one of the two input terminals being connected to the first of the seven output terminals of the transformation circuit and the other of the two input terminals being connected to the first of the seven output terminals of the timing generator;

a second logical AND circuit with two input terminals and one output terminal, one of the two input terminals being connected to the second of the seven output terminals of the transformation circuit and the other of the two input terminals being connected to the second of the seven output terminals of the timing generator;

a third logical AND circuit with two input terminals and one output terminal, one of the two input terminals being connected to the third of the seven output terminals of the transformation circuit and the other of the two input terminals being connected to the third of the seven output terminals of the timing generator;

a fourth logical AND circuit with two input terminals and one output terminal. one of the two input terminals being connected to the fourth of the seven output terminals of the transformation circuit and the other of the two input terminals being connected to the fourth of the seven output terminals of the timing generator;

a fifth logical AND circuit with two input terminals and one output terminal, one of the two input terminals being connected to the fifth of the seven output terminals of the transformation circuit and the other of the two input terminals being connected to the fifth of the seven output terminals of the timing generator;

a sixth logical AND circuit with two input terminals and one output terminal, one of the two input terminals being connected to the sixth of the seven output terminals of the transformation circuit and the other of the two input terminals being connected to the sixth of the seven output terminals of the timing generator;

a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and a logical OR circuit with seven input terminals and one output terminal, whose input terminals are connected to the seven output terminals of the first to seventh logical AND circuits.

12. The communication method according to claim 4, wherein the modulation is carried out by a modulation circuit comprising:

a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1", a timing generation circuit having seven output terminals, the timing generation circuit:

generating a pulse at the first output terminal only during the first half-cycle of four cycles;

generating a pulse at the second output terminal only during the second half-cycle of four cycles;

generating a pulse at the third output terminal only during the third half-cycle of four cycles;

generating a pulse at the fourth output terminal only during the fourth half-cycle of four cycles;
generating a pulse at the fifth output terminal only during the fifth half-cycle of four cycles;
generating a pulse at the sixth output terminal only during the sixth half-cycle of four cycles;
generating a pulse at the seventh output terminal only during the seventh half-cycle of four cycles;
a first logical AND circuit with two input terminals and one output terminal, one of the two input terminals being connected to the first of the seven output terminals of the transformation circuit and the other of the two input terminals being connected to the first of the seven output terminals of the timing generator;
a second logical AND circuit with two input terminals and one output terminal. one of the two input terminals being connected to the second of the seven output terminals of the transformation circuit and the other of the two input terminals being connected to the second of the seven output terminals of the timing generator;
a third logical AND circuit with two input terminals and one output terminal, one of the two input terminals being connected to the third of the seven output terminals of the transformation circuit and the other of the two input terminals being connected to the third of the seven output terminals of the timing generator;
a fourth logical AND circuit with two input terminals and one output terminal, one of the two input terminals being connected to the fourth of the seven output terminals of the transformation circuit and the other of the two input terminals being connected to the fourth of the seven output terminals of the timing generator;
a fifth logical AND circuit with two input terminals and one output terminal, one of the two input terminals being connected to the fifth of the seven output terminals of the transformation circuit and the other of the two input terminals being connected to the fifth of the seven output terminals of the timing generator;
a sixth logical AND circuit with two input terminals and one output terminal, one of the two input terminals being connected to the sixth of the seven output terminals of the transformation circuit and the other of the two input terminals being connected to the sixth of the seven output terminals of the timing generator;
a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and
a logical OR circuit with seven input terminals and one output terminal, whose input terminals are connected to the seven output terminals of the first to seventh logical AND circuits.

13. The communications device according to claim 5, where the modulation circuit comprises:
a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1",
a timing generation circuit having seven output terminals, the timing generation circuit:
generating a pulse at the first output terminal only during the first half-cycle of four cycles;
generating a pulse at the second output terminal only during the second half-cycle of four cycles;
generating a pulse at the third output terminal only during the third half-cycle of four cycles;
generating a pulse at the fourth output terminal only during the fourth half-cycle of four cycles;
generating a pulse at the fifth output terminal only during the fifth half-cycle of four cycles;
generating a pulse at the sixth output terminal only during the sixth half-cycle of four cycles;
generating a pulse at the seventh output terminal only during the seventh half-cycle of four cycles;
a first logical AND circuit with two input terminals and one output terminal, one of the two input terminals being connected to the first of the seven output terminals of the transformation circuit and the other of the two input terminals being connected to the first of the seven output terminals of the timing generator;
a second logical AND circuit with two input terminals and one output terminal, one of the two input terminals being connected to the second of the seven output terminals of the transformation circuit and the other of the two input terminals being connected to the second of the seven output terminals of the timing generator;
a third logical AND circuit with two input terminals and one output terminal, one of the two input terminals being connected to the third of the seven output terminals of the transformation circuit and the other of the two input terminals being connected to the third of the seven output terminals of the timing generator;
a fourth logical AND circuit with two input terminals and one output terminal, one of the two input terminals being connected to the fourth of the seven output terminals of the transformation circuit and the other of the two input terminals being connected to the fourth of the seven output terminals of the timing generator;
a fifth logical AND circuit with two input terminals and one output terminal, one of the two input terminals being connected to the fifth of the seven output terminals of the transformation circuit and the other of the two input terminals being connected to the fifth of the seven output terminals of the timing generator;
a sixth logical AND circuit with two input terminals and one output terminal, one of the two input terminals being connected to the sixth of the seven output terminals of the transformation circuit and the other of the two input terminals being connected to the sixth of the seven output terminals of the timing generator;
a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and
a logical OR circuit with seven input terminals and one output terminal, whose input terminals are connected to the seven output terminals of the first to seventh logical AND circuits.

14. The receiver according to claim 6, wherein the modulation is carried out by a modulation circuit comprising:
a transformation circuit having four input terminals and seven output terminals, which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1",
a timing generation circuit having seven output terminals, the timing generation circuit:
generating a pulse at the first output terminal only during the first half-cycle of four cycles;

generating a pulse at the second output terminal only during the second half-cycle of four cycles;

generating a pulse at the third output terminal only during the third half-cycle of four cycles;

generating a pulse at the fourth output terminal only during the fourth half-cycle of four cycles;

generating a pulse at the fifth output terminal only during the fifth half-cycle of four cycles;

generating a pulse at the sixth output terminal only during the sixth half-cycle of four cycles;

generating a pulse at the seventh output terminal only during the seventh half-cycle of four cycles;

a first logical AND circuit with two input terminals and one output terminal, one of the two input terminals being connected to the first of the seven output terminals of the transformation circuit and the other of the two input terminals being connected to the first of the seven output terminals of the timing generator;

a second logical AND circuit with two input terminals and one output terminal. one of the two input terminals being connected to the second of the seven output terminals of the transformation circuit and the other of the two input terminals being connected to the second of the seven output terminals of the timing generator;

a third logical AND circuit with two input terminals and one output terminal, one of the two input terminals being connected to the third of the seven output terminals of the transformation circuit and the other of the two input terminals being connected to the third of the seven output terminals of the timing generator;

a fourth logical AND circuit with two input terminals and one output terminal, one of the two input terminals being connected to the fourth of the seven output terminals of the transformation circuit and the other of the two input terminals being connected to the fourth of the seven output terminals of the timing generator;

a fifth logical AND circuit with two input terminals and one output terminal, one of the two input terminals being connected to the fifth of the seven output terminals of the transformation circuit and the other of the two input terminals being connected to the fifth of the seven output terminals of the timing generator;

a sixth logical AND circuit with two input terminals and one output terminal, one of the two input terminals being connected to the sixth of the seven output terminals of the transformation circuit and the other of the two input terminals being connected to the sixth of the seven output terminals of the timing generator;

a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and a logical OR circuit with seven input terminals and one output terminal, whose input terminals are connected to the seven output terminals of the first to seventh logical AND circuits.

15. The communication device according to claim 7, wherein the modulation circuit comprises:

a transformation circuit having four input terminals and seven output terminals. which transforms 4-bit data given into the four input terminals into a total of sixteen types of outputs, namely seven types of outputs, wherein respectively one of the seven output terminals is "1", and nine types of outputs, wherein respectively two different non-adjacent output terminals of the seven output terminals are "1", a timing generation circuit having seven output terminals, the timing generation circuit:

generating a pulse at the first output terminal only during the first half-cycle of four cycles;

generating a pulse at the second output terminal only during the second half-cycle of four cycles;

generating a pulse at the third output terminal only during the third half-cycle of four cycles;

generating a pulse at the fourth output terminal only during the fourth half-cycle of four cycles;

generating a pulse at the fifth output terminal only during the fifth half-cycle of four cycles;

generating a pulse at the sixth output terminal only during the sixth half-cycle of four cycles;

generating a pulse at the seventh output terminal only during the seventh half-cycle of four cycles;

a first logical AND circuit with two input terminals and one output terminal, one of the two input terminals being connected to the first of the seven output terminals of the transformation circuit and the other of the two input terminals being connected to the first of the seven output terminals of the timing generator;

a second logical AND circuit with two input terminals and one output terminal, one of the two input terminals being connected to the second of the seven output terminals of the transformation circuit and the other of the two input terminals being connected to the second of the seven output terminals of the timing generator;

a third logical AND circuit with two input terminals and one output terminal, one of the two input terminals being connected to the third of the seven output terminals of the transformation circuit and the other of the two input terminals being connected to the third of the seven output terminals of the timing generator;

a fourth logical AND circuit with two input terminals and one output terminal, one of the two input terminals being connected to the fourth of the seven output terminals of the transformation circuit and the other of the two input terminals being connected to the fourth of the seven output terminals of the timing generator;

a fifth logical AND circuit with two input terminals and one output terminal, one of the two input terminals being connected to the fifth of the seven output terminals of the transformation circuit and the other of the two input terminals being connected to the fifth of the seven output terminals of the timing generator;

a sixth logical AND circuit with two input terminals and one output terminal, one of the two input terminals being connected to the sixth of the seven output terminals of the transformation circuit and the other of the two input terminals being connected to the sixth of the seven output terminals of the timing generator;

a seventh logical AND circuit with two input terminals and one output terminal, one of the two input terminals being connected to the seventh of the seven output terminals of the transformation circuit and the other of the two input terminals being connected to the seventh of the seven output terminals of the timing generator; and a logical OR circuit with seven input terminals and one output terminal, whose input terminals are connected to the seven output terminals of the first to seventh logical AND circuits.

* * * * *